United States Patent
Nam

(10) Patent No.: US 7,153,752 B2
(45) Date of Patent: Dec. 26, 2006

(54) METHODS FOR FORMING CAPACITORS AND CONTACT HOLES OF SEMICONDUCTOR DEVICES SIMULTANEOUSLY

(75) Inventor: Sang Woo Nam, Cheongju-si (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 29 days.

(21) Appl. No.: 10/743,608

(22) Filed: Dec. 22, 2003

(65) Prior Publication Data

US 2004/0137692 A1 Jul. 15, 2004

(30) Foreign Application Priority Data

Dec. 24, 2002 (KR) ............... 10-2002-0083527

(51) Int. Cl.
*H01L 21/4763* (2006.01)
(52) U.S. Cl. ............ 438/396; 438/253; 438/637; 257/306; 257/E21.176
(58) Field of Classification Search ........ 438/396, 438/253, 637; 257/E21.176
See application file for complete search history.

(56) References Cited

U.S. PATENT DOCUMENTS

| | | | |
|---|---|---|---|
| 5,874,355 A * | 2/1999 | Huang et al. ............ 438/627 |
| 5,882,999 A | 3/1999 | Anderson et al. ........ 438/629 |
| 5,918,135 A * | 6/1999 | Lee et al. ............... 438/393 |
| 6,117,747 A * | 9/2000 | Shao et al. ............. 438/396 |
| 6,166,423 A * | 12/2000 | Gambino et al. ......... 257/532 |
| 6,200,629 B1 * | 3/2001 | Sun ....................... 427/79 |
| 6,259,128 B1 * | 7/2001 | Adler et al. ............ 257/301 |
| 6,329,234 B1 * | 12/2001 | Ma et al. ............... 438/210 |
| 6,346,454 B1 * | 2/2002 | Sung et al. ............. 438/396 |
| 6,387,775 B1 | 5/2002 | Jang et al. ............. 438/396 |
| 6,803,306 B1 * | 10/2004 | Tsau ..................... 438/622 |
| 2002/0086492 A1 * | 7/2002 | Tsau ..................... 438/396 |

* cited by examiner

*Primary Examiner*—Bradley K. Smith
*Assistant Examiner*—Steven J. Fulk
(74) *Attorney, Agent, or Firm*—Saliwanchik, Lloyd & Saliwanchik

(57) ABSTRACT

A method for forming a capacitor and a contact hole of a semiconductor device substantially simultaneously is disclosed. According to one example, a metal layer and a TiN layer are deposited in sequence on a substrate and, then, etched through a pattern to form a capacitor part and a contact hole part on the substrate. A insulating layer and an ILD layer are formed in sequence over the substrate including the capacitor part and the contact hole part. Through etching processes using photoresist patterns as masks, openings are formed in the capacitor part and the contact hole part. The openings are filed with tungsten to form tungsten plugs. As disclosed herein, device defects may be reduced using a damascene process to fabricate a semiconductor device with simple structure by using a tungsten plug as an upper metal layer of a capacitor.

2 Claims, 4 Drawing Sheets

METHODS FOR FORMING CAPACITORS AND CONTACT HOLES OF SEMICONDUCTOR DEVICES SIMULTANEOUSLY

TECHNICAL FIELD

The present disclosure relates to semiconductor fabrication and, more particularly, to methods for forming capacitors and contact holes of semiconductor devices simultaneously.

BACKGROUND

In fabricating semiconductor devices or, in particular, analog devices, capacitors must be formed in most cases and a contact hole has to be formed to connect a lower metal layer to another metal line. Generally, the contact hole is formed before or after the formation of the capacitor.

FIGS. 1a and 1b illustrate, in cross-sectional views, a known process for forming a capacitor of a semiconductor device. Referring to FIG. 1a, a metal such as copper or aluminum is deposited on a substrate (not shown) to form a metal line 1'. A titanium nitride (TiN) layer 2' is deposited on the metal line 1'. The TiN layer 2' is used as a lower metal layer of a capacitor. An insulating layer 3' such as oxide or nitride is formed on the TiN layer 2' and an upper metal layer 4' is formed on the insulating layer 3'. Then, a mask layer such as a photoresist pattern 5' is formed on the upper metal layer 4'. Next, some parts of the upper metal layer 4', the insulating layer 3', and the TiN layer 2' are removed by wet or dry etching using the photoresist pattern as a mask. As a result, as shown in FIG. 1b, a capacitor comprising the upper metal layer 4', the insulating layer 3', and the TiN layer 2' is formed on the metal line 1'.

For example, U.S. Pat. No. 6,117,747 to Shao et al. discloses a method for fabricating a metal-oxide capacitor using a dual damascene process. U.S. Pat. No. 6,387,775 to Jang et al. discloses a method for forming a metal-insulator-metal (MIM) capacitor while preserving the dielectric capacitor during the trench etch. As another example, U.S. Pat. No. 6,329,234 to Ma et al. discloses a structure and a method for fabricating copper metal-insulator-metal (MIM) capacitors and thick metal inductors simultaneously with only one mask in a damascene and dual damascene trench/via process. High performance device structures formed by Ma et el. patent include: parallel plate capacitor bottom metal (CBM) electrodes and capacitor top metal (CTM) electrodes, MIM capacitors, thick inductor metal wiring, interconnects and contact vias.

However, if a capacitor and a contact hole are formed separately, the process for manufacturing a semiconductor device become unnecessarily longer and more complicated and probability of defect occurrence increases. In addition, in an etching process, it is difficult to accurately adjust depth and location of etch-stop and conduct process control because both a lower metal layer and a metal line are formed of metals and an etch selectivity of the lower metal layer to the metal line is low.

DETAILED DESCRIPTION

Figure 1A:
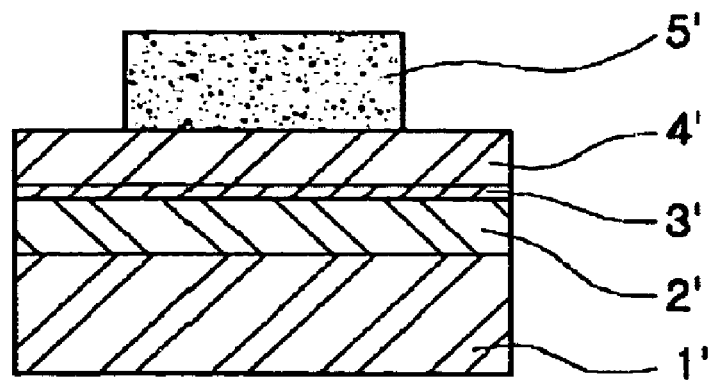
FIGS. 1a and 1b illustrate, in cross-sectional views, a known process of forming a capacitor of a semiconductor device.
Figure 1B:
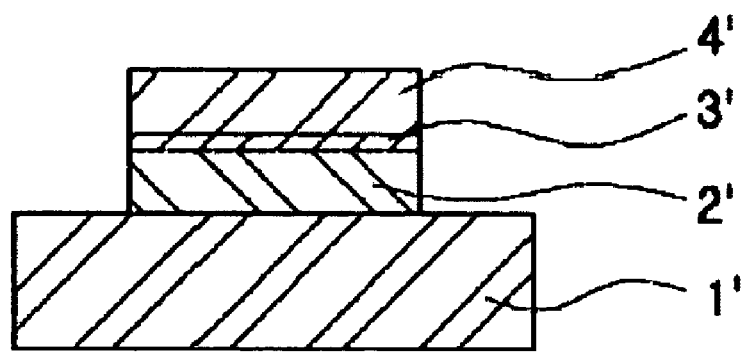
Figure 2A:
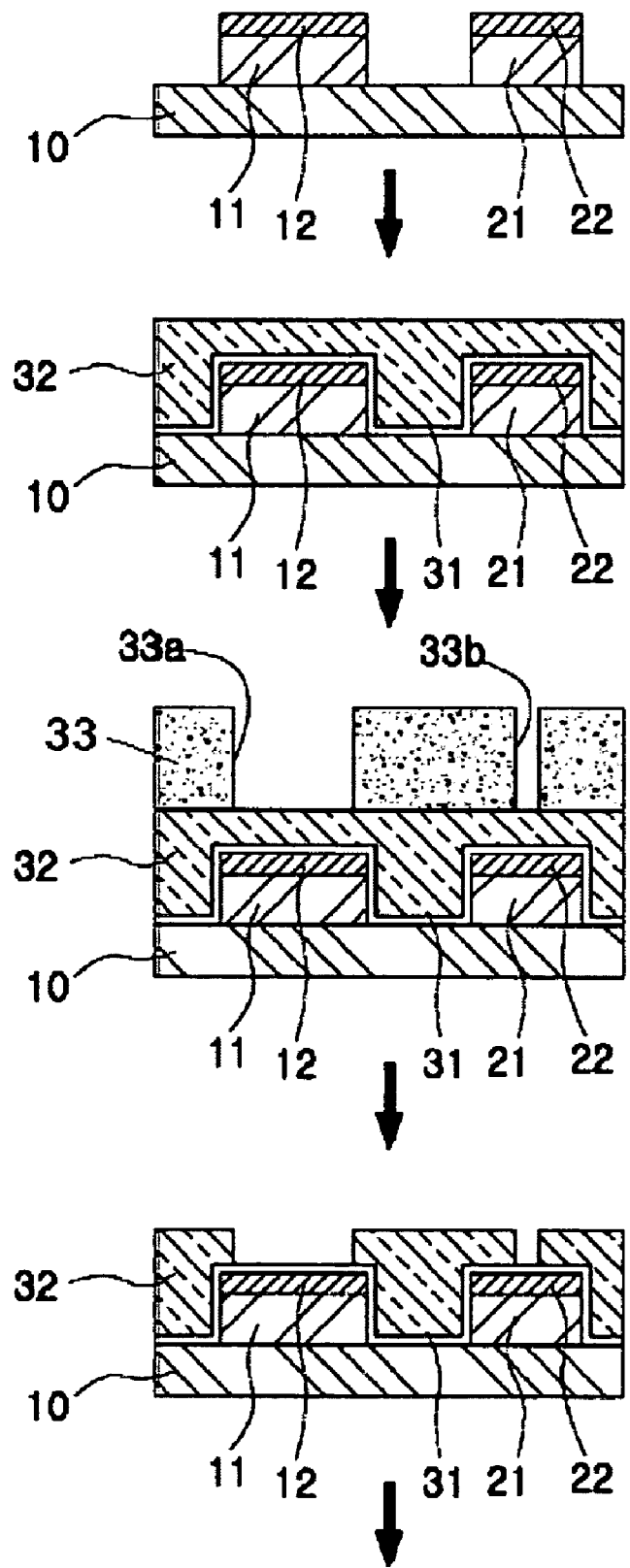
FIGS. 2a and 2b illustrate, in cross-sectional views, the process of forming a capacitor and a contact hole of a semiconductor device simultaneously.
Figure 2B:
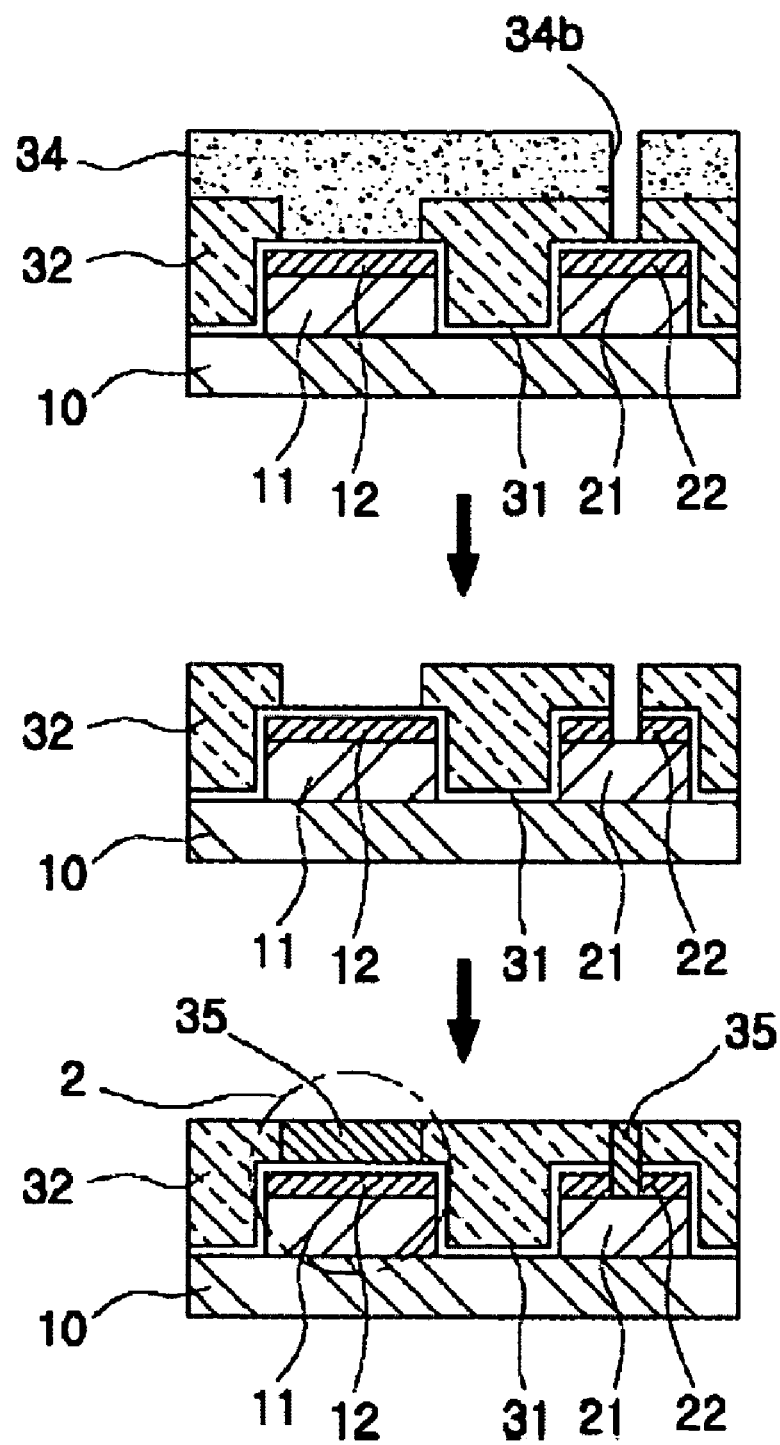

Referring to FIGS. 2a and 2b, a metal layer and a titanium nitride (TiN) layer are deposited on a substrate 10 in sequence. A pattern is formed on the TiN layer and some parts of the metal layer and the TiN layer are removed through the pattern to form a capacitor part comprising a metal layer 11 and a TiN layer 12 and a contact hole part comprising a metal layer 21 and a TiN layer 22. The metal layers 11 and 21 may be formed of Al, Al/Cu alloy, Cu, etc. The TiN layers 12 and 22 may be formed through plasma sputtering using a Ti target.

Then, an insulating layer 31 with an appropriate thickness is formed over the substrate 10 including the capacitor part and the contact hole part. An interlayer dielectric (ILD) layer 32, which is thicker than the insulating layer 31, is formed on the insulating layer. In one example, the insulating layer 31 is formed of nitride (e.g., $Si_3N_4$) to prevent short circuiting between the metal layers 11 and 12 and other metal layers formed later. To grow the nitride, materials such as $NH_3$, $SiH_2Cl_2$, etc. are generally used. The ILD layer 32 is formed of a material with a low dielectric constant such as, for example, silica or fluorinated silica glass (FSG, $SiO_xF_y$).

Next, a first photoresist pattern 33 with windows 33a and 33b is formed on the ILD layer 32. A first etching process is performed using the first photoresist pattern 33 as a mask. Some parts of the ILD layer 32 under the windows 33a and 33b are removed to form openings on the insulating layer 31. Here, a reactive ion etching (RIE) etcher may be used as etching equipment. Then, a second photoresist pattern 34 with a window 34b is formed on the ILD layer 32 including the openings. A second etching process is performed using the second photoresist pattern 34 as a mask. As a result, some part of the insulating layer 31 and the TiN layer 22 under the windows 34b are removed and, therefore, the opening in the contact hole part is extended to the metal layer 21. In the second etching process, the insulating layer 31 is etched using $CHF_3$, $NF_3$, or $SiF_4$ as an etching gas and the TiN layer 22 is etched through an RIE process using HF as an etching gas.

The second photoresist pattern 34 is removed and, then, the openings formed through the first and second etching processes are filled with tungsten to form tungsten plugs. In forming the tungsten plugs, preferably as in a damascene process, the tungsten is deposited over the ILD layer including the openings and planarized by a CMP (Chemical Mechanical Polishing) process. Through such damascene process, device defects can be minimized.

Figure 3:
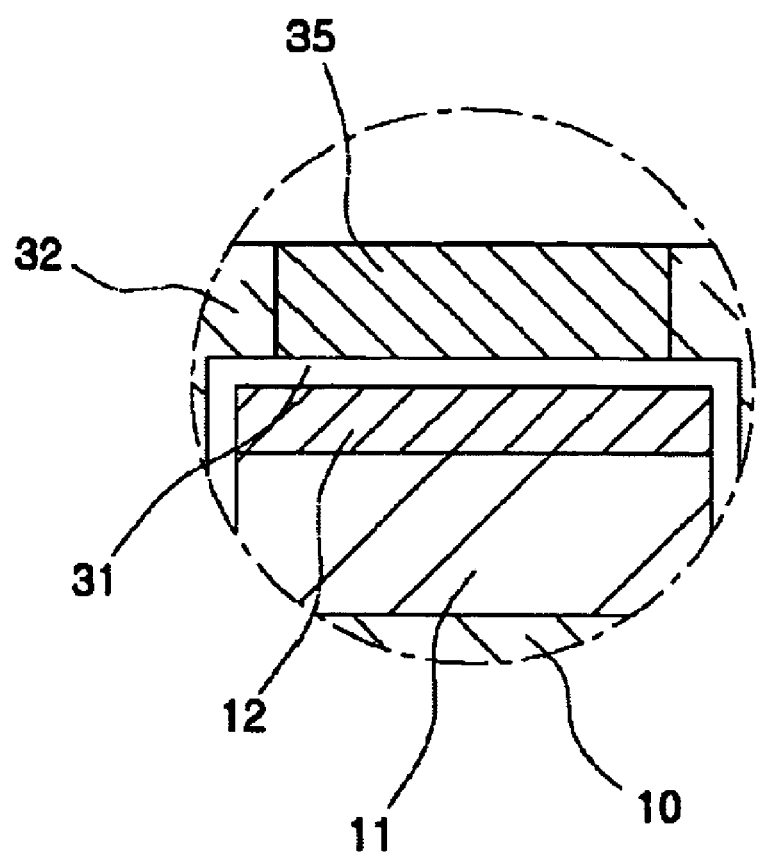
FIG. 3 is an enlarged view of an area designated with reference numeral 2 in FIG. 2b.

FIG. 3 is an enlarged view of a capacitor shown in 2 of FIG. 2b. The capacitor comprises the metal layer 11 as a lower metal layer, the insulating layer 31, i.e., nitride, as a capacitor dielectric layer related to capacitance, and the tungsten plug 35 as an upper metal layer.

Therefore, a capacitor as disclosed herein may comprise the metal layer as a lower metal layer, the insulating layer, and the tungsten plug as an upper metal layer. In addition, a capacitor as disclosed herein may use the TiN layer as a lower metal layer without forming a separate lower metal layer.

As disclosed above, a method for fabricating a semiconductor device simplifies processes by forming a capacitor and a contact hole substantially simultaneously. Additionally, as disclosed above, a method is provided for fabricating a semiconductor device that can easily control processes using one layer constituting a capacitor as an etch-stop layer. Accordingly, the disclosed methods and apparatus can reduce device defects by forming the upper metal layer of capacitor through a damascene process and prevent short circuit between the metal layer and the tungsten by protecting the metal layer using the insulating layer, i.e., nitride. In addition, as disclosed herein a semiconductor device may be fabricated with a simple structure by using the tungsten plug, which connects metal lines, as an upper metal layer of a capacitor.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method for forming a capacitor and a contact hole of a semiconductor device simultaneously comprising the steps of:

depositing a metal layer on a substrate;

depositing a titanium nitride (TiN) layer directly on the metal layer;

forming a pattern on the TiN layer and making a capacitor part and a contact hole part using the pattern, the capacitor part comprising some portion of the metal layer and the TiN layer as a lower metal layer of the capacitor, the contact hole part comprising another portion of the metal layer and the TiN layer;

forming an insulating layer with a predetermined thickness over the substrate including the capacitor part and the contact hole part;

forming an interlayer dielectric (ILD) layer on the insulating layer, the ILD layer being relatively thicker than the insulating layer;

forming a first photoresist pattern on the ILD;

removing some parts of the ILD layer by an etching process using the first photoresist pattern as a mask in order to form openings on the insulating layer in the capacitor part and the contact hole part;

forming a second photoresist pattern over the ILD layer including the openings;

removing some part of the insulating layer and the TiN layer in the contact hole part by an etching process using the second photoresist pattern as a mask in order to extend the opening in the contact hole part to the metal layer;

removing the second photoresist pattern; and filling the openings with tungsten to form tungsten plugs.

2. The method as defined by claim 1, wherein the metal layer of the capacitor part is used as a lower metal layer of a capacitor, the insulating layer is formed of nitride, and the tungsten plug on the capacitor part is used as an upper metal layer of a capacitor.

* * * * *